United States Patent
Takahashi

(10) Patent No.: US 9,806,538 B2
(45) Date of Patent: Oct. 31, 2017

(54) MEASUREMENT CIRCUIT AND MEASUREMENT APPARATUS FOR WIRELESS POWER TRANSMISSION SYSTEM

(71) Applicant: Murata Manufacturing Co., Ltd., Nagaokakyo-shi, Kyoto-fu (JP)

(72) Inventor: Hironobu Takahashi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 299 days.

(21) Appl. No.: 14/699,066

(22) Filed: Apr. 29, 2015

(65) Prior Publication Data

US 2015/0249347 A1 Sep. 3, 2015

Related U.S. Application Data

(63) Continuation of application No. PCT/JP2013/073892, filed on Sep. 5, 2013.

(30) Foreign Application Priority Data

Dec. 27, 2012 (JP) .................................. 2012-283939

(51) Int. Cl.
*H01F 27/42* (2006.01)
*H02J 5/00* (2016.01)
(Continued)

(52) U.S. Cl.
CPC .............. *H02J 5/005* (2013.01); *G01R 31/40* (2013.01); *H02J 50/05* (2016.02)

(58) Field of Classification Search
CPC ............ H02J 5/005; H02J 50/05; G01R 31/40
See application file for complete search history.

(56) References Cited

U.S. PATENT DOCUMENTS 9,319,107 B2 * 4/2016 Kato .................... H04B 5/0037
9,589,721 B2 * 3/2017 Endo ....................... H02J 17/00
(Continued)

FOREIGN PATENT DOCUMENTS

JP H08-205334 A 8/1998
JP 2005-79788 A 3/2005
(Continued)

OTHER PUBLICATIONS

International Search Report for PCT/JP2013/073892, dated Oct. 29, 2013.
(Continued)

*Primary Examiner* — Kenneth B Wells
(74) *Attorney, Agent, or Firm* — Arent Fox LLP

(57) ABSTRACT

A measurement apparatus includes a pseudo-coupling circuit, a power reception circuit, and a characteristics measuring unit. The pseudo-coupling circuit includes a first power-transmission-side terminal, a second power-transmission-side terminal, a first power-reception-side terminal, and a second power-reception-side terminal. A capacitor is connected between the first power-transmission-side terminal and the first power-reception-side terminal. A capacitor is connected between the first power-transmission-side terminal and the second power-transmission-side terminal. A capacitor is connected between the first power-reception-side terminal and the second power-reception-side terminal. A power transmission module to be measured is connected to the first and second power-transmission-side terminals. The power reception circuit and the characteristics measuring unit are connected to the first and second power-reception-side terminals.

20 Claims, 5 Drawing Sheets

(51) Int. Cl.
*G01R 31/40* (2014.01)
*H02J 50/05* (2016.01)

(56) References Cited

U.S. PATENT DOCUMENTS

2012/0249161 A1 10/2012 Tabuchi
2012/0262005 A1 10/2012 Camurati et al.
2013/0249313 A1 9/2013 Tsuchiya et al.

FOREIGN PATENT DOCUMENTS

| JP | 2009-72011 A | 4/2009 |
| JP | 2009-89520 A | 4/2009 |
| JP | 2009-531009 A | 8/2009 |
| JP | 2010-154670 A | 7/2010 |
| JP | 2012-208038 A | 10/2012 |
| WO | 2012/144848 A1 | 10/2012 |

OTHER PUBLICATIONS

Written Opinion of the International Searching Authority for PCT/JP2013/073892, dated Oct. 29, 2013.

* cited by examiner

PRIOR ART

PRIOR ART

MEASUREMENT CIRCUIT AND MEASUREMENT APPARATUS FOR WIRELESS POWER TRANSMISSION SYSTEM

CROSS-REFERENCE TO RELATED APPLICATIONS

The present application is a continuation of PCT/JP2013/073892 filed Sep. 5, 2013, which claims priority to Japanese Patent Application No. 2012-283939, filed Dec. 27, 2012, the entire contents of each of which are incorporated herein by reference.

The present invention relates to a measurement circuit and a measurement apparatus for a wireless power transmission system that transmits power from a power transmission apparatus to a power reception apparatus without connecting the power transmission apparatus to the power reception apparatus.

BACKGROUND OF THE INVENTION

Power transmission systems using magnetic field coupling have hitherto been in practical use as wireless power transmission systems. The power transmission systems using the magnetic field coupling include coils in power transmission apparatuses and power reception apparatuses. In the power transmission systems using the magnetic field coupling, the power-transmission-side coils are magnetically coupled to the power-reception-side coils to transmit power from the power transmission apparatuses to the power reception apparatuses.

However, such power transmission systems using the magnetic field coupling have disadvantages of degradation of transmission characteristics caused by positional shifts between the power-transmission-side coils and the power-reception-side coils, restriction on the coil shapes, heat generation in the coils, induction heating caused by metallic particles, and so on.

In contrast, various power transmission systems using electric field coupling have been proposed, as described in, for example, Patent Document 1 and Patent Document 2. The power transmission systems using the electric field coupling include coupling electrodes in power transmission apparatuses and power reception apparatuses. In the power transmission systems using the electric field coupling, the power-transmission-side coupling electrodes are electrically coupled to the power-reception-side coupling electrodes, that is, the power-transmission-side coupling electrodes and the power-reception-side coupling electrodes form capacitors and high-frequency high-voltage signals are transmitted via the capacitors to transmit power from the power transmission apparatuses to the power reception apparatuses.

Such a power transmission system using the electric field coupling has a basic configuration illustrated in FIG. 8.

FIG. 8 illustrates a basic configuration of a general power transmission system using the electric field coupling. The general power transmission system using the electric field coupling includes a power transmission apparatus 90 and a power reception apparatus 80.

The power transmission apparatus 90 includes a power transmission module 910, a power-transmission-side active electrode 920, and a power-transmission-side passive electrode 930. The power-transmission-side active electrode 920 and the power-transmission-side passive electrode 930 are connected to the power transmission module 910. A power supply (not illustrated) is connected to the power transmission module 910.

The power reception apparatus 80 includes a power reception module 810, a power-reception-side active electrode 820, and a power-reception-side passive electrode 830. A load (not illustrated) is connected to the power reception module 810.

In transmission of the power from the power transmission apparatus 90, the power reception apparatus 80 is arranged with respect to the power transmission apparatus 90 so that the power-reception-side active electrode 820 opposes the power-transmission-side active electrode 920 and the power-reception-side passive electrode 830 opposes the power-transmission-side passive electrode 930.

In the above arrangement of the power reception apparatus 80 with respect to the power transmission apparatus 90, the power-reception-side active electrode 820 and the power-transmission-side active electrode 920 produce active-side coupling capacitance (capacitor) and the power-reception-side passive electrode 830 and the power-transmission-side passive electrode 930 produce passive-side coupling capacitance (capacitor). High-voltage alternating current is supplied via the coupling capacitances to realize the power transmission from the power transmission apparatus 90 to the power reception apparatus 80.

The power reception apparatus 80 is mounted on the power transmission apparatus 90 in a manner illustrated in FIG. 9. FIG. 9 is a perspective view illustrating a mode in which the power reception apparatus is mounted on the power transmission apparatus in the wireless power transmission system. As illustrated in FIG. 9, the power transmission apparatus 90 includes a base member 91 and a back-face member 92. The base member 91 is shaped so as to protrude from the main face of the back-face member 92 toward the front direction. The power reception apparatus 80 having a plate rectangular parallelepiped housing 81 is placed on a space provided by the protrusion of the base member 91. More specifically, for example, the power-transmission-side active electrode and the power-transmission-side passive electrode are provided in the back-face member 92 of the power transmission apparatus 90. The power-reception-side active electrode and the power-reception-side passive electrode are provided in the power reception apparatus 80. Only placing the power reception apparatus 80 including the power-reception-side active electrode and the power-reception-side passive electrode on the power transmission apparatus 90 so that the power-reception-side active electrode opposes the power-transmission-side active electrode and the power-reception-side passive electrode opposes the power-transmission-side passive electrode produces the coupling capacitances in the above manner, thereby realizing the power transmission using the electric field coupling.

Patent Document 1: Japanese Unexamined Patent Application Publication (Translation of PCT Application) No. 2009-531009

Patent Document 2: Japanese Unexamined Patent Application Publication No. 2009-89520

However, the wireless power transmission systems using the electric field coupling in the related art have the following problems.

FIG. 10 is a block diagram of a measurement system for the wireless power transmission system in the related art. In the measurement system for the power reception module in the wireless power transmission system in the related art, it is necessary to prepare components and connect the components with each other based on the real apparatuses in a manner illustrated in FIG. 10 even in product inspection (characteristics measurement) of the power transmission module 910 before assembling the power transmission apparatus 90.

Specifically, in addition to the power transmission module 910 to be measured (to be inspected), the power-transmission-side active electrode 920, the power-transmission-side passive electrode 930, the power reception module 810, the power-reception-side active electrode 820, and the power-reception-side passive electrode 830 are prepared at the side of the inspection apparatus. In addition, a measurement device 70 is connected to the power reception module 810 and so on. The same applies to the inspection (the characteristics measurement) of the power reception module 810. It is necessary to prepare components and connect the components with each other based on the real apparatuses also in the inspection of the power reception module 810.

However, in such an inspection method (characteristics measurement method), it is necessary to connect the power transmission module 910 and the power reception module 810 in the same manner as in the real apparatuses each time the measurement is performed. Accordingly, the measurement is complicated to increase the scale of the characteristics measurement system.

SUMMARY OF THE INVENTION

It is an object of the present invention to provide a measurement circuit and a measurement apparatus for a wireless power transmission system, which allow characteristics measurement and inspection of the power transmission module in the power transmission apparatus and the power reception module in the power reception apparatus to be easily and precisely performed.

The present invention concerns a measurement circuit for a wireless power transmission system, which performs characteristics measurement in the wireless power transmission system that wirelessly transmits power from a power transmission apparatus to a power reception apparatus, and has the following features. The measurement circuit includes a pair of a first power-transmission-side terminal and a second power-transmission-side terminal to be connected to a power transmission circuit side and a pair of a first power-reception-side terminal and a second power-reception-side terminal to be connected to a power reception circuit side. The measurement circuit includes a series capacitor that is connected between the first power-transmission-side terminal and the first power-reception-side terminal and that simulates a coupling state between the power transmission apparatus and the power reception apparatus.

With the above configuration, only connecting the power transmission module to be measured to the first and second power-transmission-side terminals and connecting the power reception circuit (partial circuit module) and the characteristics measuring unit to the first and second power-reception-side terminals reproduces the pseudo electric field coupling state between the power transmission apparatus and the power reception apparatus. In addition, only connecting the power reception module to be measured to the first and second power-reception-side terminals and connecting the power transmission circuit (partial circuit module) and the characteristics measuring unit to the first and second power-transmission-side terminals reproduces the pseudo electric field coupling state between the power transmission apparatus and the power reception apparatus. Accordingly, it is possible to perform the characteristics measurement precisely without forming the actual arrangement state of the power transmission apparatus and the power reception apparatus, that is, the wireless arrangement state (capacitive coupling state).

The measurement circuit for the wireless power transmission system of the present invention preferably has the following configuration. The measurement circuit includes at least one of a first parallel capacitor connected between the first power-transmission-side terminal and the second power-transmission-side terminal and a second parallel capacitor connected between the first power-reception-side terminal and the second power-reception-side terminal.

The measurement circuit for the wireless power transmission system of the present invention preferably includes a resistor connected in series to the series capacitor.

The measurement circuit for the wireless power transmission system of the present invention preferably includes a second series capacitor connected between the second power-transmission-side terminal and the second power-reception-side terminal.

The measurement circuit for the wireless power transmission system of the present invention may have the following configuration. The measurement circuit includes at least one of a first additional capacitor connected between the first power-transmission-side terminal and the second power-reception-side terminal and a second additional capacitor connected between the second power-transmission-side terminal and the first power-reception-side terminal.

With the above configurations, it is possible to reproduce the electric field coupling state between the power transmission apparatus and the power reception apparatus with higher accuracy.

A measurement apparatus for a wireless power transmission system of the present invention is characterized by having the following configuration. The measurement apparatus includes any of the measurement circuits described above; an inspection power reception circuit connected to the first power-reception-side terminal and the second power-reception-side terminal; a characteristics measuring unit that measures characteristics of a power transmission module to be measured; a first power transmission line that enables the power transmission module to be connectable to the first power-transmission-side terminal; and a second power transmission line that enables the power transmission module to be connectable to the second power-transmission-side terminal.

With the above configuration, it is possible to measure the characteristics of the power transmission module reliably and precisely without forming the actual arrangement state of the power transmission apparatus and the power reception apparatus, that is, the wireless arrangement state (capacitive coupling state).

A measurement apparatus for a wireless power transmission system of the present invention is characterized by having the following configuration. The measurement apparatus includes any of the measurement circuits described above; an inspection power transmission circuit connected to the first power-transmission-side terminal and the second power-transmission-side terminal; a characteristics measuring unit that measures characteristics of a power reception module to be measured; a first power reception line that enables the power reception module to be connectable to the first power-reception-side terminal and the characteristics measuring unit; and a second power reception line that enables the power reception module to be connectable to the second power-reception-side terminal and the characteristics measuring unit.

With the above configuration, it is possible to measure the characteristics of the power reception module reliably and precisely without forming the actual arrangement state of the power transmission apparatus and the power reception apparatus, that is, the wireless arrangement state (capacitive coupling state).

According to the present invention, it is possible to perform the characteristics measurement and the inspection of the power transmission module and the power reception module for the wireless power transmission system easily and precisely.

DETAILED DESCRIPTION OF THE EXEMPLARY EMBODIMENTS

Figure 1:
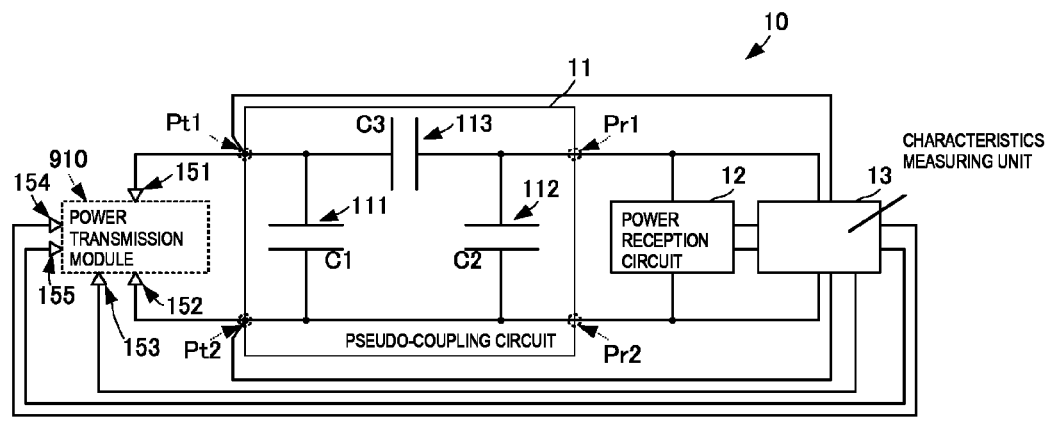
FIG. 1 is a block diagram of a measurement circuit and a measurement apparatus for a wireless power transmission system according to a first embodiment of the present invention.

A measurement circuit and a measurement apparatus for a wireless power transmission system according to a first embodiment of the present invention will herein be described with reference to the attached drawings. FIG. 1 is a block diagram of the measurement circuit and the measurement apparatus for the wireless power transmission system according to the first embodiment of the present invention. A mode of the measurement apparatus is described in the present embodiment, in which characteristics measurement of a power transmission module in a power transmission apparatus is performed.

A measurement apparatus 10 includes a pseudo-coupling circuit 11, a power reception circuit 12, and a characteristics measuring unit 13. The pseudo-coupling circuit 11 corresponds to a "measurement circuit" of the present invention.

The pseudo-coupling circuit 11 is a circuit that reproduces a pseudo arrangement state (capacitive coupling state) of a power reception module of a real power reception apparatus and the power transmission module of the real power transmission apparatus. The pseudo-coupling circuit 11 includes a first power-transmission-side terminal Pt1, a second power-transmission-side terminal Pt2, a first power-reception-side terminal Pr1, and a second power-reception-side terminal Pr2. The first and second power-transmission-side terminals Pt1 and Pt2 and the first and second power-reception-side terminals Pr1 and Pr2 may be practical electrode pads or may be specific intermediate positions on the connection wirings for the circuit.

A capacitor 113 is connected between the first power-transmission-side terminal Pt1 and the first power-reception-side terminal Pr1. The capacitor 113 corresponds to a "series capacitor" of the present invention.

A capacitor 111 is connected between the first power-transmission-side terminal Pt1 and the second power-transmission-side terminal Pt2. The capacitor 111 corresponds to a "first parallel capacitor" of the present invention.

A capacitor 112 is connected between the first power-reception-side terminal Pr1 and the second power-reception-side terminal Pr2. The capacitor 112 corresponds to a "second parallel capacitor" of the present invention.

With the above configuration, the pseudo-coupling circuit 11 realizes an equivalent circuit for a coupling capacitance generator that is composed of the power transmission apparatus including the power transmission module 910 to be measured and the power reception apparatus including the power reception circuit 12 and that is based on the mode of the real apparatuses. Specifically, the pseudo-coupling circuit 11 appropriately sets capacitances C1, C2, and C3 of the capacitors 111, 112, and 113, respectively, to reproduce equivalent circuit constants of the coupling capacitance generator of the real apparatuses.

The power reception circuit 12 includes a circuit similar to that of the power reception module of the real power reception apparatus. For example, when the power reception module of the real power reception apparatus is arranged in a housing of the device of the power reception apparatus, for example, a circuit resulting from extraction of only the circuitry of the power reception module is used. The power reception circuit 12 may include the power reception module of the real power reception apparatus and a circuit corresponding to the load of the real power reception apparatus. The circuit corresponding to the load of the real power reception apparatus may be separately provided and the circuit may be connected to the power reception circuit 12. Alternatively, the power reception circuit 12 may be a circuit simulating the power reception module of the real power reception apparatus.

The power reception circuit 12 is connected to the first power-reception-side terminal Pr1 and the second power-reception-side terminal Pr2 in the pseudo-coupling circuit 11. The connection specifications are based on the connection specifications between the power reception module and the power-reception-side active electrode and power-reception-side passive electrode in the real power reception apparatus. However, unlike the real power transmission apparatus, the wireless arrangement state with the capacitive coupling is not used and direct connection is adopted.

The characteristics measuring unit 13 is connected to an input portion of the power transmission module 910; the first power-transmission-side terminal Pt1, the second power-transmission-side terminal Pt2, the first power-reception-side terminal Pr1, and the second power-reception-side terminal Pr2 in the pseudo-coupling circuit 11; and an output portion of the power reception circuit 12. The characteristics measuring unit 13 measures electrical characteristics of input voltage and output voltage, input current and output current, and so on for the power transmission module 910 and the power reception circuit 12. In addition, the characteristics measuring unit 13 measures various characteristics of a power supply, such as efficiency, from the electrical characteristics. Furthermore, the characteristics measuring unit 13 measures the voltage (the voltage between the first and second power-transmission-side terminals Pt1 and Pt2) and the frequency of transmission alternating current (AC) of the pseudo-coupling circuit 11 and the voltage (the voltage between the first and second power-reception-side terminals Pr1 and Pr2) and the frequency of reception alternating current (AC) of the pseudo-coupling circuit 11.

One end of a first power transmission line 151 is connected to the first power-transmission-side terminal Pt1 in the pseudo-coupling circuit 11. The other end of the first power-transmission-side line 151 is shaped so as to be connectable to the power transmission module 910 to be measured. One end of a second power transmission line 152 is connected to the second power-transmission-side terminal Pt2 in the pseudo-coupling circuit 11. The other end of the second power-transmission-side line 152 is shaped so as to be connectable to the power transmission module 910 to be measured. The first power-transmission-side line 151 and the second power-transmission-side line 152 are based on the connection specifications between the power transmission module and the power-transmission-side active electrode and power-transmission-side passive electrode in the real power transmission apparatus. However, unlike the real power transmission apparatus, the wireless arrangement state with the capacitive coupling is not used and direct connection is adopted.

One end of a control line 153 is connected to the characteristics measuring unit 13. The other end of the control line 153 is shaped so as to be connectable to the power transmission module 910 to be measured. The other end of the control line 153 is connected to a control circuit in the power transmission module 910 in the measurement.

Figure 2:
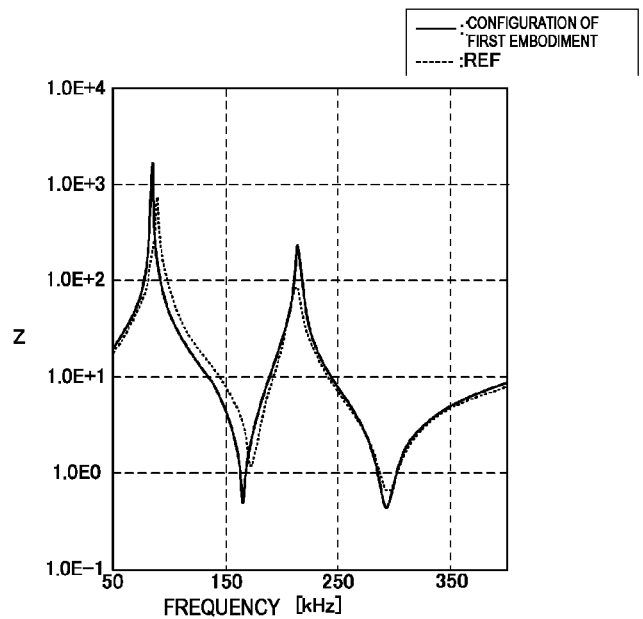
FIG. 2 is a graph illustrating impedance characteristics when a pseudo-coupling circuit 11 side (first and second power-transmission-side terminals Pt1 and Pt2 side) is viewed from a power transmission module 910 in the measurement apparatus of the first embodiment of the present invention and impedance characteristics when the power reception side is viewed from the power transmission module in a real power transmission apparatus.

FIG. 2 is a graph illustrating impedance characteristics when the pseudo-coupling circuit 11 side (the first and second power-transmission-side terminals Pt1 and Pt2 side) is viewed from the power transmission module 910 in the measurement apparatus of the first embodiment and impedance characteristics when the power reception side is viewed from the power transmission module in the wirelessly connected real power transmission apparatus. Referring to FIG. 2, the horizontal axis represents frequency and the vertical axis represents impedance Z.

As illustrated in FIG. 2, appropriately setting the capacitances C1, C2, and C3 of the capacitors 111, 112, and 113, respectively, in the pseudo-coupling circuit 11 allows the impedance characteristics substantially coinciding with the impedance characteristics obtained when the wirelessly connected real power transmission apparatus is used to be realized.

As described above, the use of the configuration in the present embodiment allows the characteristics measurement of the power transmission module in the power transmission apparatus in the wireless power transmission system to be performed reliably and precisely (with high accuracy) without using the wireless connection configuration similar to the one in the real power transmission apparatus. When the above configuration is used, the measurement apparatus having the same mode as that of the real apparatuses may not be provided and, thus, the compact measurement apparatus can be manufactured with the simple configuration. In addition, it is possible to reduce the workload of a measurement process.

The measurement is performed through the following process. First, the measurement apparatus 10 is prepared. Then, the first and second power-transmission-side lines 151 and 152 in the measurement apparatus 10 are connected to an output portion of the power transmission module 910, the control line 153 is connected to the control circuit in the power transmission module 910, and first and second power-transmission-side measurement lines 154 and 155 are connected to the input portion of the power transmission module 910. A power supply (not illustrated) is connected to the power transmission module 910.

Then, a control signal is transmitted from the characteristics measuring unit 13 to the power transmission module 910 through the control line 153 to control turning-on and turning-off of the power supply. Power is transmitted from the power transmission module 910 in accordance with the content of the control. The transmitted power is received by the power reception circuit 12 through the pseudo-coupling circuit 11. Here, since the pseudo-coupling circuit 11 has the above configuration, the power reception circuit 12 can receive the power in substantially the same power reception mode as that in the real power reception apparatus.

The characteristics measuring unit 13 measures the electrical characteristics of the power transmission module 910, the pseudo-coupling circuit 11, and the power reception circuit 12. The characteristics measuring unit 13 inspects the power transmission module 910 on the basis of the result of the measurement of the electrical characteristics. The power transmission apparatus 90 is manufactured by mounting the power transmission module 910 that is determined to be a non-defective product through the inspection in a housing of the power transmission apparatus 90.

Figure 3:
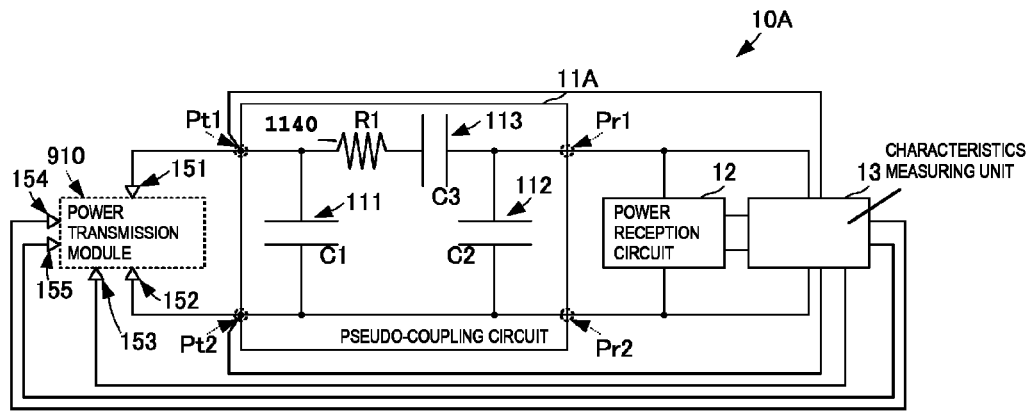
FIG. 3 is a block diagram of a measurement circuit and a measurement apparatus for a wireless power transmission system according to a second embodiment of the present invention.

Next, a measurement circuit and a measurement apparatus for a wireless power transmission system according to a second embodiment of the present invention will herein be described with reference to the attached drawings. FIG. 3 is a block diagram of the measurement circuit and the measurement apparatus for the wireless power transmission system according to the second embodiment of the present invention.

A measurement apparatus 10A in the wireless power transmission system of the present embodiment differs from the measurement apparatus 10 according to the first embodiment in the configuration of a pseudo-coupling circuit 11A (corresponding to the "measurement circuit" of the present invention). Accordingly, only portions different from the measurement apparatus 10 according to the first embodiment will be specifically described.

The pseudo-coupling circuit 11A includes a resistor 1140, in addition to the components in the pseudo-coupling circuit 11 according to the first embodiment. The resistor 1140 is connected in series to the capacitor 113. Here, one end of the resistor 1140 is connected to the node between the capacitor 111 and the first power-transmission-side terminal Pt1, and the other end of the resistor 1140 is connected to the capacitor 113. The resistor 1140 may be connected to the first power-reception-side terminal Pr1 side of the capacitor 113.

Figure 4:
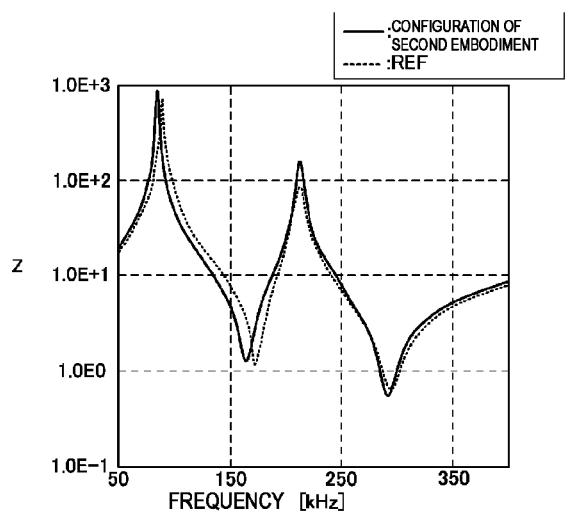
FIG. 4 is a graph illustrating impedance characteristics when a pseudo-coupling circuit 11A side (first and second power-transmission-side terminals Pt1 and Pt2 side) is viewed from the power transmission module 910 in the measurement apparatus of the second embodiment of the present invention and impedance characteristics when the power reception side is viewed from the power transmission module in the real power transmission apparatus.

FIG. 4 is a graph illustrating impedance characteristics when the pseudo-coupling circuit 11A side (the first and second power-transmission-side terminals Pt1 and Pt2 side) is viewed from the primary side of a step-up transformer (not illustrated) in the power transmission module 910 in the measurement apparatus of the second embodiment and impedance characteristics when the power reception side is viewed from the power transmission module in the wirelessly connected real power transmission apparatus. Referring to FIG. 4, the horizontal axis represents frequency and the vertical axis represents the impedance Z.

As illustrated in FIG. 4, appropriately adjusting the capacitances C1, C2, and C3 of the capacitors 111, 112, and 113, respectively, in the pseudo-coupling circuit 11A and appropriately setting a resistance value R1 of the resistor 1140 allow the impedance characteristics more precisely coinciding with the impedance characteristics of the wirelessly connected real power transmission apparatus to be realized. It is considered that this is because the loss in a non-contact coupling state occurring in the mode of the real apparatuses can be simulated with the resistance value R1 of the resistor 1140.

As described above, the use of the configuration in the present embodiment allows the characteristics measurement of the power transmission module in the power transmission apparatus in the wireless power transmission system to be performed reliably and more precisely (with high accuracy).

Figure 5:
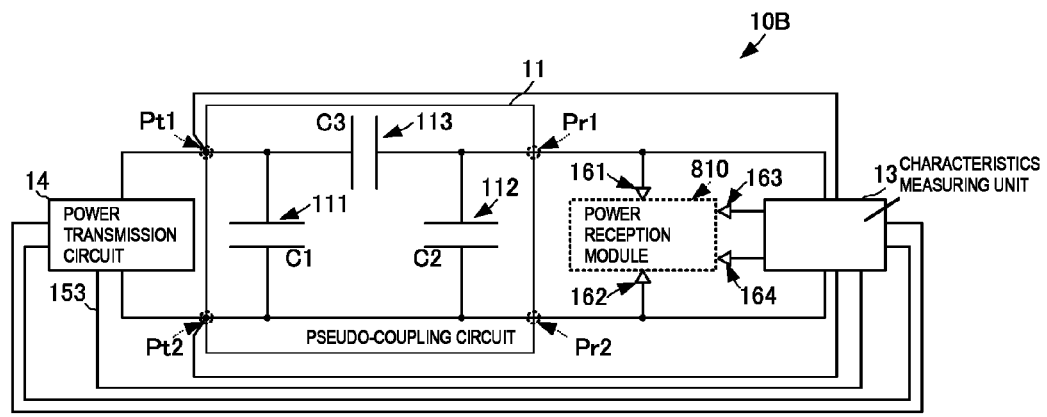
FIG. 5 is a block diagram of a measurement circuit and a measurement apparatus for a wireless power transmission system according to a third embodiment of the present invention.

Next, a measurement circuit and a measurement apparatus for a wireless power transmission system according to a third embodiment will herein be described with reference to the attached drawing. FIG. 5 is a block diagram of the measurement circuit and the measurement apparatus for the wireless power transmission system according to the third embodiment of the present invention.

Although the measurement apparatus performing the characteristics measurement of the power transmission module is described in the first and second embodiments, a mode of the measurement apparatus performing the characteristics measurement of the power reception module in the power reception apparatus will be described. Accordingly, only portions different from the first embodiment will be specifically described.

A measurement apparatus 10B includes the pseudo-coupling circuit 11, the characteristics measuring unit 13, and a power transmission circuit 14.

The power transmission circuit 14 includes a circuit similar to that of the power transmission module of the real power transmission apparatus. For example, when the power transmission module of the real power transmission apparatus is arranged in the housing of the power transmission apparatus, for example, a circuit resulting from extraction of only the circuitry of the power transmission module is used. The power transmission circuit 14 may include the power transmission module of the real power transmission apparatus and a circuit corresponding to the power supply. The power supply may be separately provided and the power supply may be connected to the power transmission circuit 14. The power transmission circuit 14 may be a circuit simulating the power transmission module of the real power transmission apparatus.

The power transmission circuit 14 is connected to the first power-transmission-side terminal Pt1 and the second power-transmission-side terminal Pt2 in the pseudo-coupling circuit 11. The connection specifications are based on the connection specifications between the power transmission module and the power-transmission-side active electrode and power-transmission-side passive electrode in the real power transmission apparatus. However, unlike the real power transmission apparatus, the wireless arrangement state with the capacitive coupling is not used and direct connection is adopted.

The characteristics measuring unit 13 is connected to an input portion of the power transmission circuit 14 and the first power-transmission-side terminal Pt1, the second power-transmission-side terminal Pt2, the first power-reception-side terminal Pr1, and the second power-reception-side terminal Pr2 in the pseudo-coupling circuit 11. The characteristics measuring unit 13 is configured so as to be connected to an output portion of the power reception module 810 to be measured via first and second power-reception-side measurement lines 163 and 164. The control line 153 is connected to the power transmission circuit 14. The first power-reception-side terminal Pr1 and the second power-reception-side terminal Pr2 are configured so as to be connected to an input portion of the power reception module 810 to be measured via first and second power-reception-side lines 161 and 162, respectively. The first power-reception-side line 161 and the second power-reception-side line 162 are based on the connection specifications between the power reception module and the power-reception-side active electrode and power-reception-side passive electrode in the real power reception apparatus. However, unlike the real power transmission apparatus, the wireless arrangement state with the capacitive coupling is not used and direct connection is adopted.

As described above, the use of the configuration in the present embodiment allows the characteristics measurement of the power reception module in the power reception apparatus in the wireless power transmission system to be performed reliably and precisely (with high accuracy) without using the wireless connection configuration similar to the one in the real power reception apparatus.

The measurement is performed through the following process. First, the measurement apparatus 10B is prepared. Then, the first and second power-reception-side lines 161 and 162 in the measurement apparatus 10B are connected to the input portion of the power reception module 810 and the first and second power-reception-side measurement lines 163 and 164 are connected to the output portion of the power reception module 810. A power supply (not illustrated) is connected to the power transmission circuit 14.

Then, a control signal is transmitted from the characteristics measuring unit 13 to the power transmission circuit 14 through the control line 153 to control turning-on and turning-off of the power supply. Power is transmitted from the power transmission circuit 14 in accordance with the content of the control. The transmitted power is received by the power reception module 810 through the pseudo-coupling circuit 11. Here, since the pseudo-coupling circuit 11 has the above configuration, the power reception module 810 can receive the power in substantially the same power reception mode as that in the real power reception apparatus.

The characteristics measuring unit 13 measures the electrical characteristics of the power reception module 810, the power transmission circuit 14, and the pseudo-coupling circuit 11. The characteristics measuring unit 13 inspects the power reception module 810 on the basis of the result of the measurement of the electrical characteristics. The power reception apparatus 80 is manufactured by mounting the power reception module 810 that is determined to be a non-defective product through the inspection in the housing of the power reception apparatus 80.

The pseudo-coupling circuit 11A described in the above second embodiment may be used in the present embodiment.

Figure 6:
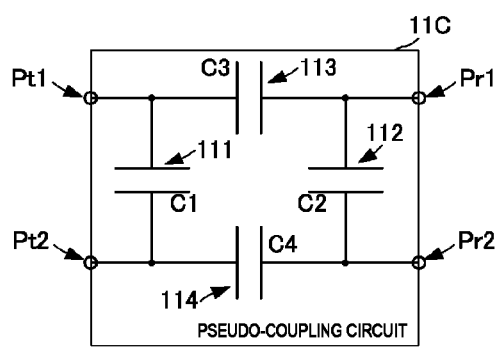
FIG. 6 is a circuit diagram of a measurement circuit (pseudo-coupling circuit) for a wireless power transmission system according to a fourth embodiment of the present invention.

Next, a measurement circuit for a wireless power transmission system according to a fourth embodiment will herein be described with reference to the attached drawing. FIG. 6 is a circuit diagram of the measurement circuit (pseudo-coupling circuit) for the wireless power transmission system according to the fourth embodiment of the present invention. A pseudo-coupling circuit 11C of the present embodiment is replaced with the pseudo-coupling circuits 11 and 11A described in the above embodiments and the basic configuration as the measurement apparatus is the same as that in the above embodiments.

The pseudo-coupling circuit 11C includes a capacitor 114, in addition to the components in the pseudo-coupling circuit 11 described in the first embodiment. The capacitor 114 corresponds to a "second series capacitor" of the present invention.

The capacitor 114 is connected in series between the second power-transmission-side terminal Pt2 and the second power-reception-side terminal Pr2. Here, the capacitor 114 is connected between the node between the second power-transmission-side terminal Pt2 and the capacitor 111 and the node between the second power-reception-side terminal Pr2 and the capacitor 112.

With the above configuration, the pseudo-coupling circuit 11C appropriately sets the capacitances C1, C2, C3, and C4 of the capacitors 111, 112, 113, and 114, respectively, to reproduce equivalent circuit constants of the coupling capacitance generator of the real apparatuses.

In addition, the use of the above configuration allows the coupling capacitance to be reproduced with higher accuracy. Accordingly, it is possible to perform the characteristics measurement with higher accuracy.

The resistor described in the second embodiment may be added to the configuration of the present embodiment. With this configuration, it is possible to realize the more accurate characteristics measurement.

Figure 7:
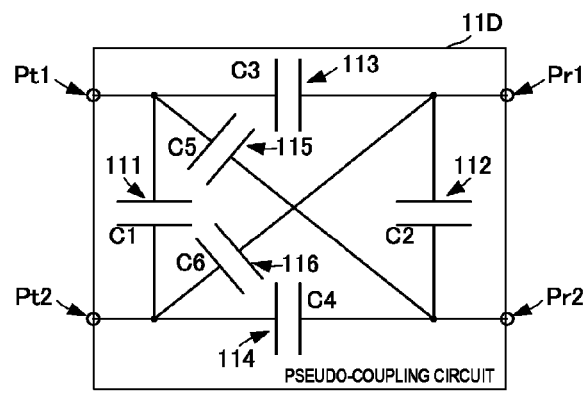
FIG. 7 is a circuit diagram of a measurement circuit (pseudo-coupling circuit) for a wireless power transmission system according to a fifth embodiment of the present invention.
Figure 8:
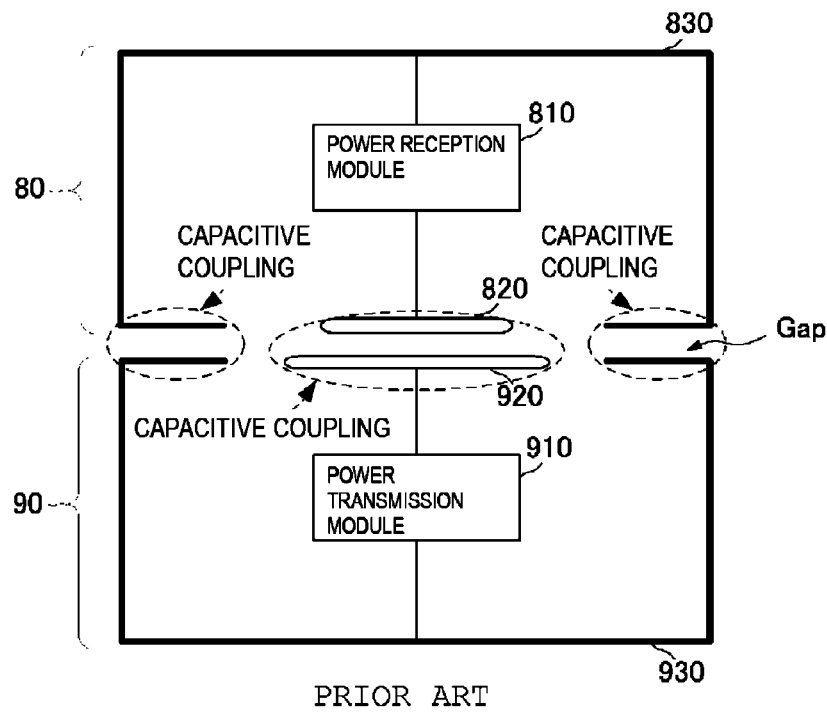
FIG. 8 illustrates a basic configuration of a general power transmission system using electric field coupling.
Figure 9:
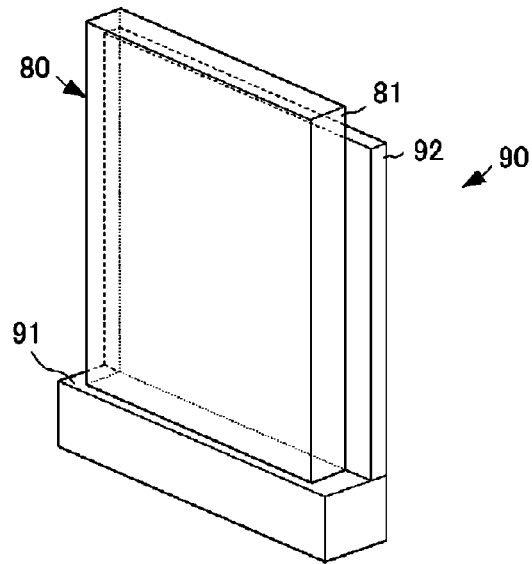
FIG. 9 is a perspective view illustrating a mode in which a power reception apparatus is mounted on a power transmission apparatus in a wireless power transmission system.
Figure 10:
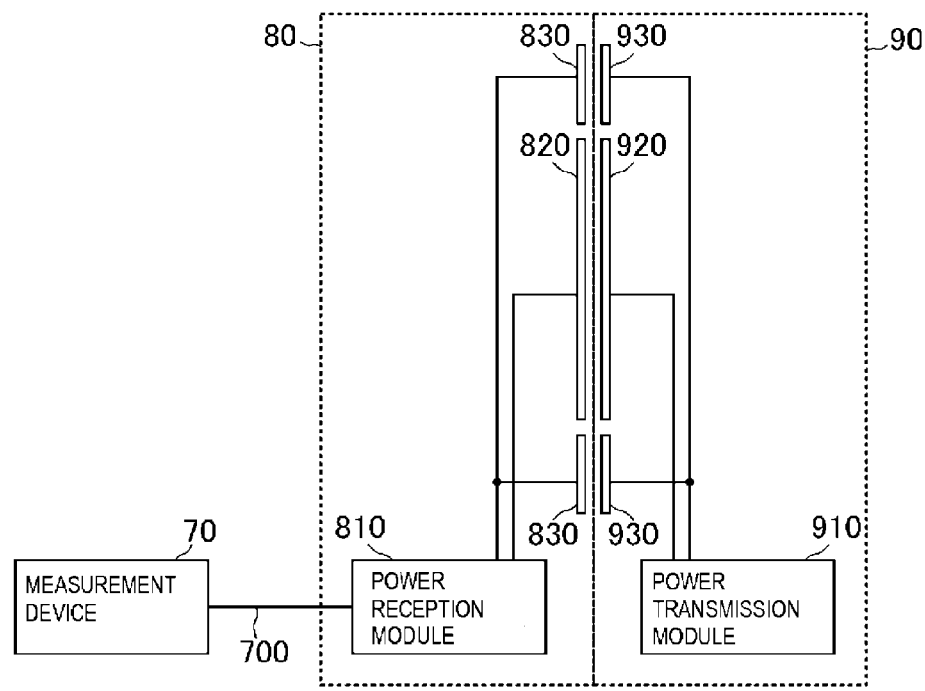
FIG. 10 is a block diagram of a measurement system for the wireless power transmission system in the related art.

Next, a measurement circuit for a wireless power transmission system according to a fifth embodiment will herein be described with reference to the attached drawing. FIG. 7 is a circuit diagram of the measurement circuit (pseudo-coupling circuit) for the wireless power transmission system according to the fifth embodiment of the present invention. A pseudo-coupling circuit 11D of the present embodiment is replaced with the pseudo-coupling circuits 11, 11A, and 11C described in the above embodiments and the basic configuration as the measurement apparatus is the same as that in the above embodiments.

The pseudo-coupling circuit 11D includes capacitors 115 and 116, in addition to the components in the pseudo-coupling circuit 11C illustrated in the fourth embodiment. The capacitors 115 and 116 correspond to "first and second additional capacitors" of the present invention.

The capacitor 115 is connected between the node between the first power-transmission-side terminal Pt1 and the capacitor 111 and the node between the second power-reception-side terminal Pr2 and the capacitor 112. The capacitor 116 is connected between the node between the second power-transmission-side terminal Pt2 and the capacitor 111 and the node between the first power-reception-side terminal Pr1 and the capacitor 112.

With the above configuration, the pseudo-coupling circuit 11D appropriately sets the capacitances C1 to C6 of the capacitors 111 to 116, respectively, to reproduce equivalent circuit constants of the coupling capacitance generator of the real apparatuses.

In addition, the use of the above configuration allows the coupling capacitance to be reproduced with higher accuracy. Specifically, the coupling capacitance occurring between the power-transmission-side active electrode and the power-reception-side passive electrode and the coupling capacitance occurring between the power-reception-side active electrode and the power-transmission-side passive electrode can also be reproduced. Accordingly, it is possible to perform the characteristics measurement with higher accuracy.

The resistor described in the second embodiment may be added to the configuration of the present embodiment. With this configuration, it is possible to realize the more accurate characteristics measurement.

The resistor, which is to be added, may be connected in series to any of the capacitors 111, 112, 113, 114, 115, and 116.

In addition, resistors may be connected in series to all the capacitors 111, 112, 113, 114, 115, and 116. With this configuration, it is possible to realize the more accurate characteristics measurement.

Although the first parallel capacitor, the second parallel capacitor, and so on are arranged in the pseudo-coupling circuits 11, 11A, 11C, and 11D, the provision of at least the capacitor 113 corresponding to the "series capacitor" of the present invention allows the pseudo arrangement state (capacitive coupling state) of the power reception module of the real power reception apparatus and the power transmission module of the real power transmission apparatus to be reproduced. However, it is preferred that the first parallel capacitor, the second parallel capacitor, the second series capacitor, the first additional capacitor, and the second additional capacitor be further provided, in addition to the "series capacitor", for the characteristics measurement and the inspection with high accuracy.

REFERENCE SIGNS LIST

- 10, 10A, 10B: measurement apparatus
- 11, 11A, 11C, 11D: pseudo-coupling circuit (measurement circuit)
- 12: power reception circuit
- 13: characteristics measuring unit
- 14: power transmission circuit
- 111: capacitor (first parallel capacitor)
- 112: capacitor (second parallel capacitor)
- 113: capacitor (series capacitor)
- 114: capacitor (second series capacitor)
- 115, 116: capacitors (first additional capacitor, second additional capacitor)
- 151: first power-transmission-side line
- 152: second power-transmission-side line
- 153: control line
- 154: first power-transmission-side measurement line
- 155: second power-transmission-side measurement line
- 161: first power-reception-side line
- 162: second power-reception-side line
- 163: first power-reception-side measurement line
- 164: second power-reception-side measurement line
- 80: power reception apparatus
- 81: housing
- 810: power reception module
- 820: power-reception-side active electrode
- 830: power-reception-side passive electrode
- 90: power transmission apparatus 91: base member
92: back-face member
910: power transmission module
920: power-transmission-side active electrode
930: power-transmission-side passive electrode

The invention claimed is:

1. A measurement apparatus for a power transmission module used in a wireless power transmission system that wirelessly transmits power from the power transmission module to a power reception module, the measurement apparatus comprising:
a pair of power-transmission-side terminals configured to be connected to a power transmission circuit;
a pair of power-reception-side terminals configured to be connected to a power reception circuit;
a first power transmission line that connects the power transmission module to a first terminal of the pair of power-transmission-side terminals, the first power transmission line having a first end with a shape configured to be connected to the power transmission module;
a second power transmission line that connects the power transmission module to a second terminal of the pair of power-transmission-side terminals, the second power transmission line having a first end with a shape configured to be connected to the power transmission module; and
a constant value capacitor that is connected between the first terminal of the pair of power-transmission-side terminals and a first terminal of the power-reception-side terminals and that simulates a coupling state when the power reception module is placed on the power transmission module.

2. The measurement apparatus according to claim 1, further comprising a first parallel capacitor connected between the first and second terminals of the pair of power-transmission-side terminals.

3. The measurement apparatus according to claim 2, further comprising a second parallel capacitor connected between the first terminal and a second terminal of the pair of power-reception-side terminals.

4. The measurement apparatus according to claim 3, further comprising a resistor connected in series between the first terminal of the pair of power-transmission-side terminals and to the capacitor.

5. The measurement apparatus according to claim 3, further comprising a series capacitor connected between the second terminal of the pair of power-transmission-side terminals and the second terminal of the pair of power-reception-side terminals.

6. The measurement apparatus according to claim 5, further comprising a first additional capacitor connected between the first terminal of the pair of power-transmission-side terminals and the second terminal of the pair of power-reception-side terminals.

7. The measurement apparatus according to claim 6, further comprising a second additional capacitor connected between the second terminal of the pair of power-transmission-side terminals and the first terminal of the pair of power-reception-side terminals.

8. A power transmission system comprising:
a measurement circuit including:
a pair of power-transmission-side terminals;
a pair of power-reception-side terminals; and
a capacitor that is connected between a first terminal of the pair of power-transmission-side terminals and a first terminal of the power-reception-side terminals;
a power transmission module configured to connect to the pair of power-transmission-side terminals of the measurement circuit;
a power reception circuit configured to connect to the pair of power-reception-side terminals of the measurement circuit;
a measuring unit configured to measure characteristics of the power transmission module;
a first power transmission line that connects the power transmission module to a first terminal of the pair of power-transmission-side terminals; and
a second power transmission line that connects the power transmission module to a second terminal of the pair of power-transmission-side terminals.

9. The power transmission system according to claim 8, wherein the measuring unit is connected to the pair of power-reception-side terminals.

10. The power transmission system according to claim 9, wherein the measuring unit is configured to measure electrical characteristics including input and output voltage and input and output current of at least one of the power transmission module and the power reception circuit.

11. The power transmission system according to claim 8, wherein the measurement circuit further comprises a first parallel capacitor connected between the pair of power-transmission-side terminals and a second parallel capacitor connected between the pair of power-reception-side terminals.

12. The power transmission system according to claim 11, wherein the measurement circuit further comprises a resistor connected in series between the first terminal of the pair of power-transmission-side terminals and to the capacitor.

13. The power transmission system according to claim 11, wherein the measurement circuit further comprises a series capacitor connected between a second terminal of the pair of power-transmission-side terminals and a second terminal of the pair of power-reception-side terminals.

14. The power transmission system according to claim 13, wherein the measurement circuit further comprises a first additional capacitor connected between the first terminal of the pair of power-transmission-side terminals and the second terminal of the pair of power-reception-side terminals.

15. A power transmission system comprising:
a measurement circuit including:
a pair of power-transmission-side terminals;
a pair of power-reception-side terminals; and
a capacitor that is connected between a first terminal of the pair of power-transmission-side terminals and a first terminal of the power-reception-side terminals;
a power reception module configured to connect to the pair of power-reception-side terminals of the measurement circuit;
a power transmission circuit configured to be connected to the pair of power-transmission-side terminals;
a measuring unit configured to measure characteristics of the power reception module;
a first power reception line that connects the power reception module to a first terminal of the pair of power-reception-side terminals and the measuring unit; and
a second power reception line that connects the power reception module to a second terminal of the power-reception-side terminals and the measuring unit.

16. The power transmission system according to claim 15, wherein the measurement circuit further comprises a first parallel capacitor connected between the pair of powertransmission-side terminals and a second parallel capacitor connected between the pair of power-reception-side terminals.

17. The power transmission system according to claim 16, wherein the measurement circuit further comprises a resistor connected in series between the first terminal of the pair of power-transmission-side terminals and to the capacitor.

18. The power transmission system according to claim 16, wherein the measurement circuit further comprises a series capacitor connected between a second terminal of the pair of power-transmission-side terminals and a second terminal of the pair of power-reception-side terminals.

19. The power transmission system according to claim 18, wherein the measurement circuit further comprises a first additional capacitor connected between the first terminal of the pair of power-transmission-side terminals and the second terminal of the pair of power-reception-side terminals.

20. The power transmission system according to claim 15, wherein the measuring unit is connected to the pair of power-reception-side terminals and is configured to measure electrical characteristics including input and output voltage and input and output current of the power reception module.

* * * * *